US012696514B2

(12) United States Patent     (10) Patent No.:     US 12,696,514 B2
Cao et al.                      (45) Date of Patent:        Jul. 28, 2026

(54) GaN DEVICE WITH UNIFORM ELECTRIC FIELD

(71) Applicant: Efficient Power Conversion Corporation, El Segundo, CA (US)

(72) Inventors: Jianjun Cao, Torrance, CA (US); Wen-Chia Liao, Torrance, CA (US); Muskan Sharma, Torrance, CA (US); Robert Strittmatter, Tujunga, CA (US); Alexander Lidow, Topanga, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 373 days.

(21) Appl. No.: 18/407,546

(22) Filed: Jan. 9, 2024

(65) Prior Publication Data

US 2024/0234521 A1     Jul. 11, 2024

Related U.S. Application Data

(60) Provisional application No. 63/479,060, filed on Jan. 9, 2023.

(51) Int. Cl.
  *H10D 64/00*     (2025.01)
  *H10D 30/47*     (2025.01)
  *H10D 62/10*     (2025.01)
  *H10D 62/85*     (2025.01)
  *H10D 64/62*     (2025.01)

(52) U.S. Cl.
  CPC ........... *H10D 64/112* (2025.01); *H10D 30/47* (2025.01); *H10D 62/102* (2025.01); *H10D 62/85* (2025.01); *H10D 64/62* (2025.01)

(58) Field of Classification Search
  CPC .... H10D 64/112; H10D 64/62; H10D 62/102; H10D 62/85; H10D 30/47
  USPC ......................................................... 257/288
  See application file for complete search history.

(56) References Cited

U.S. PATENT DOCUMENTS

| | | | |
|---|---|---|---|
| 8,076,698 | B2 | 12/2011 | Ueda et al. |
| 9,024,324 | B2 | 5/2015 | Teplik et al. |
| 10,096,702 | B2 | 10/2018 | Beach et al. |
| 10,395,965 | B2 | 8/2019 | Odnoblyudov et al. |
| 2005/0253168 | A1 | 11/2005 | Wu et al. |

(Continued)

FOREIGN PATENT DOCUMENTS

| | | |
|---|---|---|
| CN | 114 270 533 A | 4/2022 |
| TW | 201813092 A | 4/2018 |

(Continued)

OTHER PUBLICATIONS

Search Report issued in corresponding TW Application No. 113100777 dated Dec. 19, 2024.

*Primary Examiner* — Igwe U Anya
(74) *Attorney, Agent, or Firm* — Blank Rome LLP

(57)     ABSTRACT

An enhancement mode GaN transistor that includes a multi-region field plate which partially overlaps the gate and partially overlaps a barrier offset layer. The multi-region field plate includes a section of increased height with respect to the channel layer over the portion of the gate nearest the drain contact, and a section of reduced height with respect to the channel layer over the edge or transition of the barrier offset layer, minimizing the peak electric field at the corner of the gate and at the edge or transition of the barrier offset layer.

6 Claims, 8 Drawing Sheets

(56) References Cited

U.S. PATENT DOCUMENTS

| | | | |
|---|---|---|---|
| 2017/0352754 A1* | 12/2017 | Beach | H10D 30/4755 |
| 2023/0095367 A1 | 3/2023 | Zhao et al. | |
| 2024/0120387 A1* | 4/2024 | Otake | H10D 62/343 |

FOREIGN PATENT DOCUMENTS

| | | | |
|---|---|---|---|
| TW | 202141584 A | 11/2021 | |
| WO | WO-2023276972 A1 * | 1/2023 | H10W 74/137 |
| WO | WO-2024151571 A1 * | 7/2024 | H10W 74/137 |

* cited by examiner

GaN DEVICE WITH UNIFORM ELECTRIC FIELD

CROSS REFERENCE TO RELATED APPLICATIONS

This application claims priority from U.S. Provisional Application No. 63/479,060, filed Jan. 9, 2023, the disclosure of which is incorporated by reference herein in its entirety.

BACKGROUND OF THE INVENTION

1. Field of the Invention

The present invention relates to the field of column III nitride transistors such as gallium nitride (GaN) transistors. More particularly, the invention relates to GaN transistors with multiple insulator semiconductor interface regions.

2. Description of the Related Art

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two-dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, nitride devices are inherently normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 1 illustrates a cross-sectional view of a conventional enhancement mode GaN transistor 100 with a single layer of a surface passivating insulator (layer) 108, and is more fully described in U.S. Pat. No. 8,076,698, issued to Ueda et al. Device 100 of FIG. 1 includes substrate 101 that can be composed of silicon (Si), silicon carbide (SiC), sapphire, or other material, transition layers 102 composed of AlN and AlGaN that is about 0.1 to about 1.0 μm in thickness, buffer material 103 composed of GaN that is about 0.5 to about 10 μm in thickness, barrier material 104 composed of AlGaN where the Al to Ga ratio is about 0.1 to about 0.5 with thickness from about 0.005 to about 0.03 μm, low-doped p-type AlGaN 105, heavily doped p-type GaN 106, isolation region 107, passivation layer/region 108, ohmic contact metals 109 and 110 for the source and drain, typically composed of Ti and Al with a capping metal such as Ni and Au, and gate metal 111 typically composed of a nickel (Ni) and gold (Au) metal contact over the p-type GaN gate The conventional GaN transistor shown in FIG. 1 has several disadvantages. In most Si devices, the insulator/barrier interface (such as in FIG. 1) is not a critical parameter. In GaN transistors, however, it is a critical parameter, dominating device performance. A single layer of a surface passivating insulator, such as passivation layer 108 in FIG. 1, can be made to minimize leakage current and gate to drain capacitance, or it can be made to give high electron density in the channel and low drain field. But the single insulating passivation layer cannot be made to do both at the same time.

FIG. 2 illustrates a cross-section of a prior art GaN transistor device, disclosed in U.S. Pat. No. 10,096,702, which includes two insulators, side-by-side, between the gate and drain. The first insulator disposed between the gate and drain (near the gate) minimizes the gate leakage and fields near the gate that cause high gate-drain charge (Qgd). The second insulator disposed between the first insulator and the drain, which has a reduced thickness compared to the first insulator, minimizes electric fields at the drain contact and provides a high density of charge in the channel for low on-resistance. This advantageous result is achieved because the net electron donor density above the channel under the thicker first insulator is lower than the net electron donor density above the channel under the thinner second insulator, such that the 2DEG density in the channel under the second insulator is higher than the 2DEG density in the channel under the first insulator.

As shown in FIG. 2, the step up in thickness at the transition between the thinner first insulator and the thicker second insulator creates a corner near the gate having a high electric field, which disadvantageously reduces the breakdown voltage of the device. Accordingly, a multi-level metal field plate is provided to protect the gate from high electric fields, including the high electric field at the corner of the gate. The multi-level metal field plate is positioned above the first insulator in its entirety, while being positioned above only a portion of the second insulator, and serves to even out the electric field at the corner of the gate nearest the drain.

FIG. 3, from U.S. Pat. No. 9,024,324, shows a prior art GaN transistor with a multi-region field plate 68 having a positioning and shape defined by one or more spacing parameters, including a lateral distance between the plate and gate edge (LPG), a lateral distance between the gate edge and drain structure (LGD), and/or a uniform thickness between the gate sidewall and overlying field plate (TGP). The multi-region field plate 68 is formed in two different levels of the multi-level insulator stack 63-65 to define at least a first lower field plate dimension (LF1) and a second lower field plate dimension (LF2) which are respectively spaced apart from the underlying substrate by a first field plate height (E1) and a second field plate height (E2), thereby providing a first region of the field plate separated from the substrate by a first distance and a second region of the field plate separated from the substrate by a second distance. The resulting GaN transistor, with a smooth shield transition over the gate, has superior dynamic Rdson, lower gate to drain capacitance (Cgd), lower drain to source capacitance (Cds), and higher breakdown voltage. However, the multi-region field plate 68 in the GaN transistor of FIG. 3 is disposed over a single insulating layer 54 which extends under gate electrode 60, and does not address the above-noted issue in the GaN transistor of FIG. 2, where a high electric field exists at the corner transition of the insulator, i.e., between the thinner first insulator and the thicker second insulator.

It therefore would be desirable to provide a GaN transistor with a barrier offset layer (an insulator layer over the barrier layer) and an overlying multi-region field plate to achieve a more uniform electric field at the corner of the barrier offset layer in order to improve the breakdown voltage of the device.

SUMMARY OF THE INVENTION

The present invention in the various embodiments described below addresses the problems discussed above by providing an enhancement mode GaN transistor that includes a multi-region field plate which partially overlaps the gate and partially overlaps the barrier offset layer. The multi-region field plate includes a section of increased height with respect to the channel layer over the portion of the gate nearest the drain contact, and a section of reduced height with respect to the channel layer over the edge or transition of the barrier offset layer, minimizing the peak electric field at the corner of the gate and at the edge or transition of the barrier offset layer.

Additional metal field plates under the multi region field plate and/or above the multi field plate may be provided. One of the additional field plates can be the Ohmic contact metal for the source.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

Figure 1:
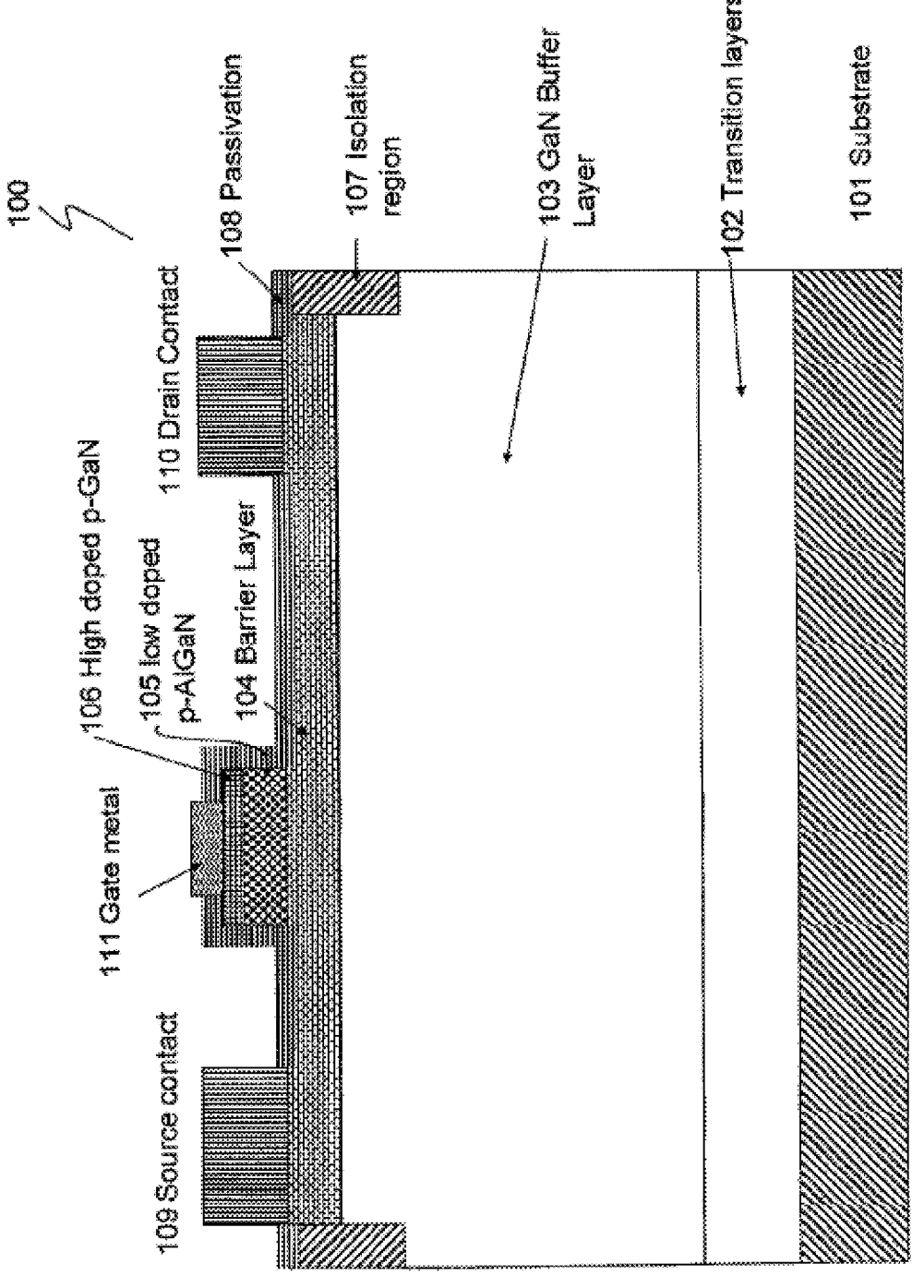
FIG. 1 illustrates a cross-sectional view of a conventional GaN transistor with a single layer of a surface passivating insulator.
Figure 2:
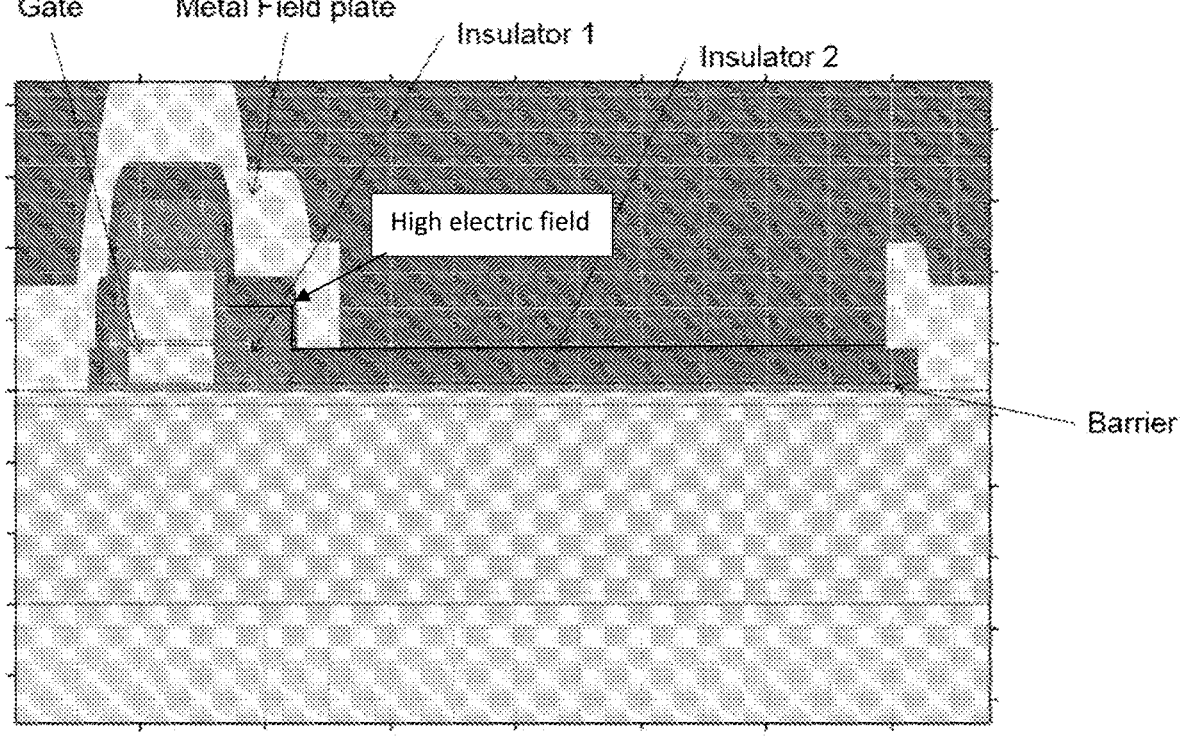
FIG. 2 illustrates a cross-sectional view of a conventional GaN transistor which has two insulators, side-by-side, between the gate and drain, of different thicknesses.
Figure 3:
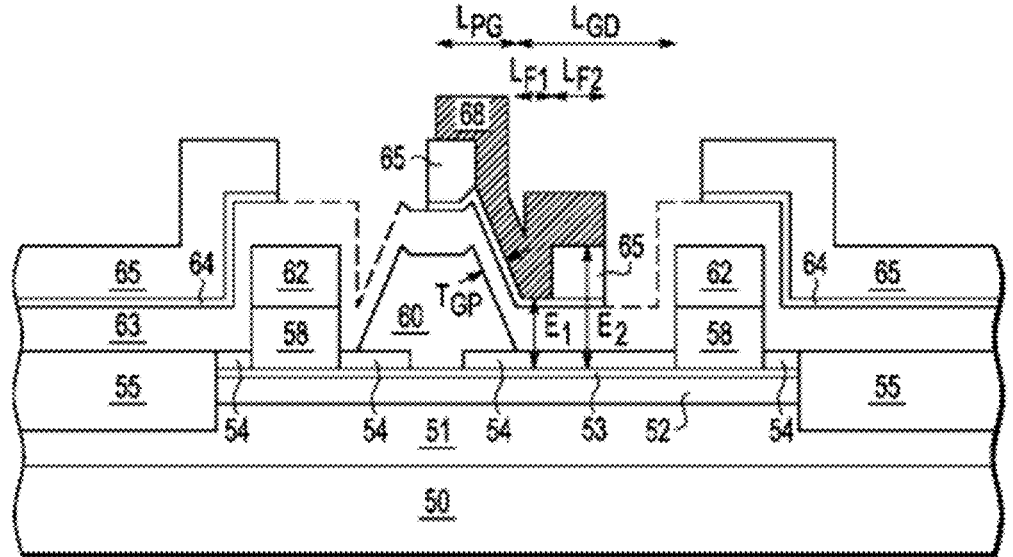
FIG. 3 illustrates a cross-sectional view of a conventional GaN transistor with a multi-region field plate.
Figure 4:
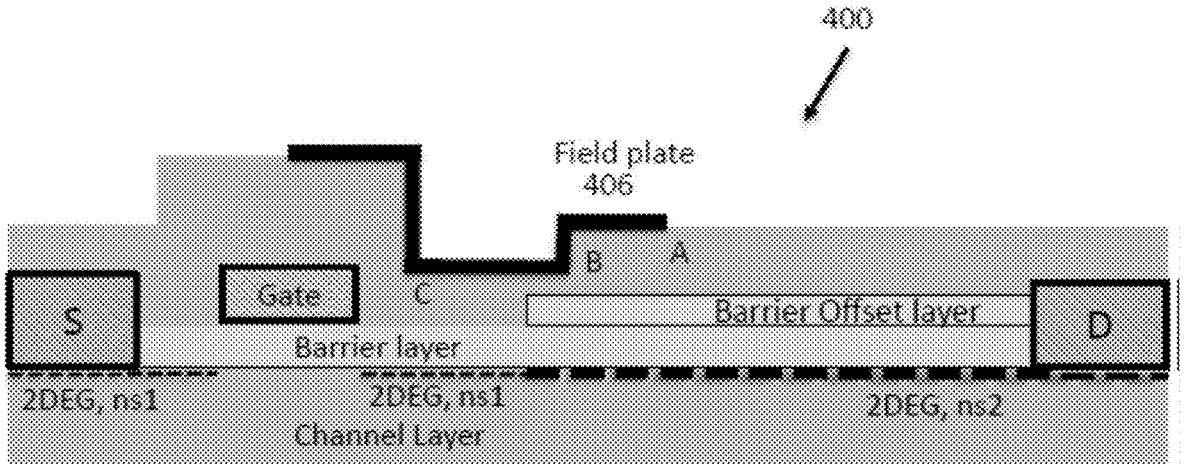
FIG. 4 illustrates a cross-sectional view of a GaN transistor formed according to a first embodiment of the present invention.

FIG. 4 illustrates a cross-sectional view of an enhancement mode GaN transistor 400 formed according to a first embodiment of the present invention. A barrier offset layer (insulator) 402, such as SiN, is provided above the front barrier layer 404 between the gate and drain contacts, spaced from the gate. The barrier offset layer has an edge or transition 408 laterally offset from the gate. Barrier offset layer 402 minimizes electric fields near the drain contact and provides a high density of charge (ns) in the underlying channel for low on-resistance. As shown in FIG. 4, barrier offset layer 402 increases the density of charge in the underlying 2DEG, such the charge ns2 under barrier offset layer 402 is greater than the charge ns1 near the gate without an overlying barrier offset layer 402.

As shown in FIG. 4, to address the above-described issue regarding a high electric field at the corner or transition of the barrier offset layer 402, the present invention includes a multi-region metal field plate 406 that protects the gate region from high fields, and also reduces the electric field at the edge or transition 408 of the barrier offset layer 402 near the gate. Multi-region field plate 406 partially overlaps the gate and partially overlaps barrier offset layer 402. Multi-region field plate 406 includes a plurality of sections of different height with respect to the barrier layer, including a section (C to B) of lowest height over the edge or transition 408 of the barrier offset layer 402, a section of greatest height overlapping the gate, and a section of intermediate height over the portion of the barrier offset layer 402 closest to the drain contact. The combination of the barrier offset layer 402 and the multi-region metal field plate 406 advantageously achieves a more uniform electric field at the corner of the gate and at the edge or transition of the barrier offset layer 402 near the gate.

Figure 5:
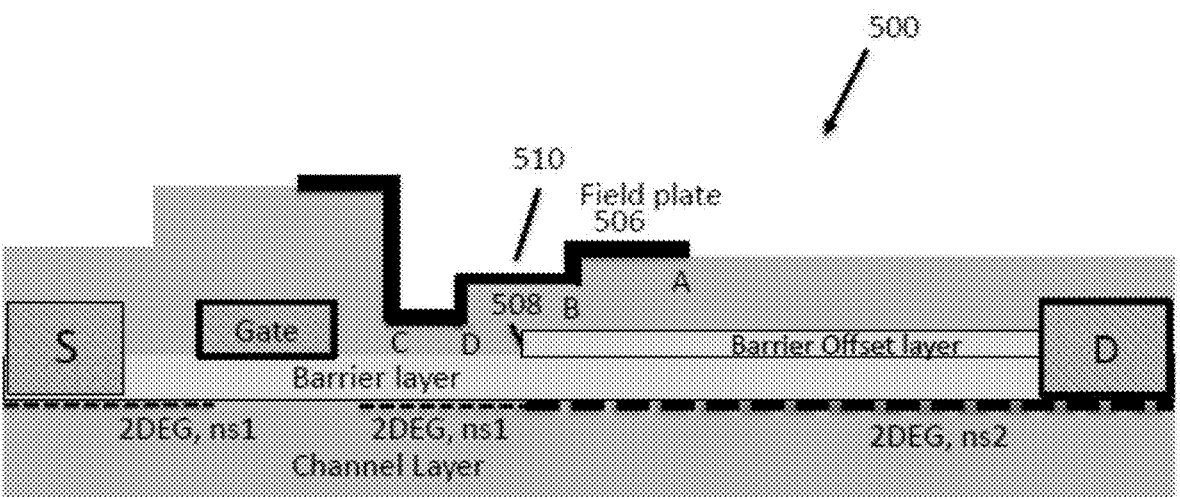
FIG. 5 illustrates a cross-sectional view of a GaN transistor formed according to a second embodiment of the present invention.

FIG. 5 shows a second embodiment of the present invention 500 with a multi-region field plate 506 having two regions, i.e., a step between C to D and D to B, in the section C to B of FIG. 4. This additional region with a step in height of field plate 510 over the edge or transition 508 of the barrier offset layer 402 further smooths the electric field at the edge or transition 508 of the barrier offset layer.

Figure 6:
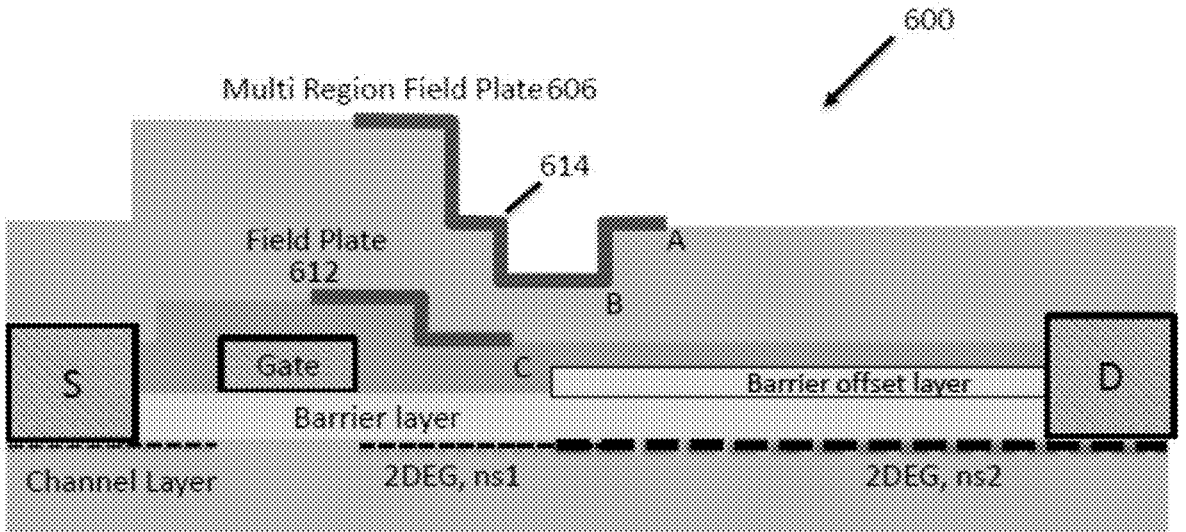
FIG. 6 illustrates a cross-sectional view of a GaN transistor formed according to a third embodiment of the present invention.

FIG. 6 shows a third embodiment 600 of the invention, with a multi-region field plate 606 (as in the embodiment of FIG. 5) and with an underlying and overlapping stepped field plate 612 over the gate. Multi-region field plate 606 is provided with a step in height on the opposite side of the step of FIG. 5, i.e., on the side nearest the gate, above the step in height of underlying field plate 612. The combination of stepped field plate 612 and stepped multi-region field plate 606 serves to reduce the electric field at the corner of the gate nearest the drain, in addition to smoothing the electric field at the edge or transition 508 of the barrier offset layer.

Figure 7:
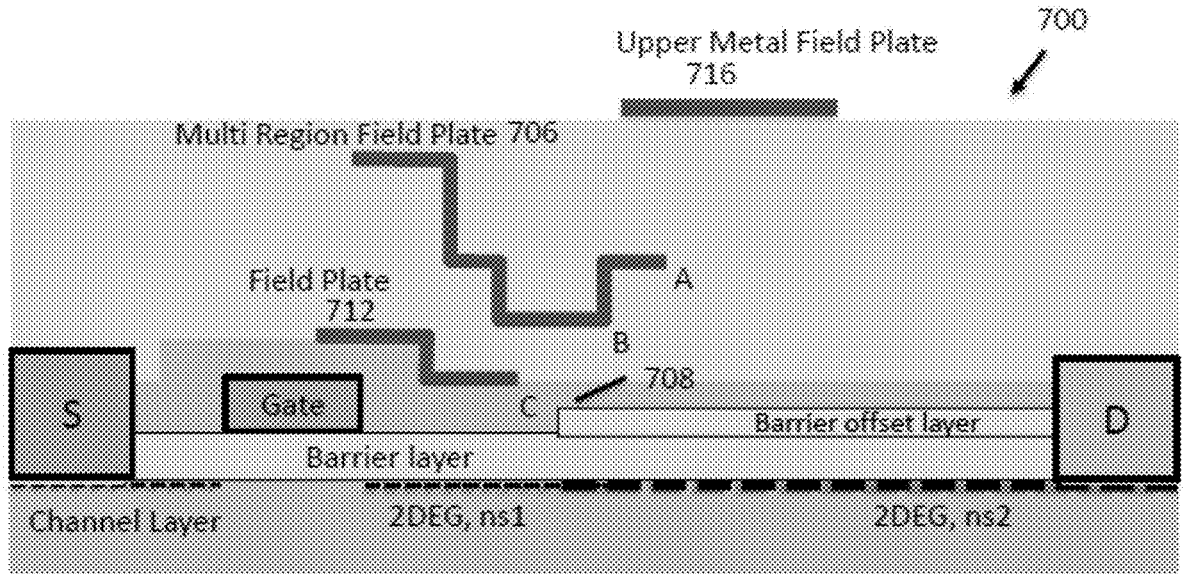
FIG. 7 illustrates a cross-sectional view of the GaN transistor formed according to fourth embodiment of the present invention.

FIG. 7 shows a fourth embodiment 700 of the invention, similar to the embodiment of FIG. 6, with an additional field plate 716 provided above and overlapping with multi-region field plate 707. Upper metal field plate 716 further smooths and reduces the electric field at the edge or transition 708 of the barrier offset layer.

Figure 8:
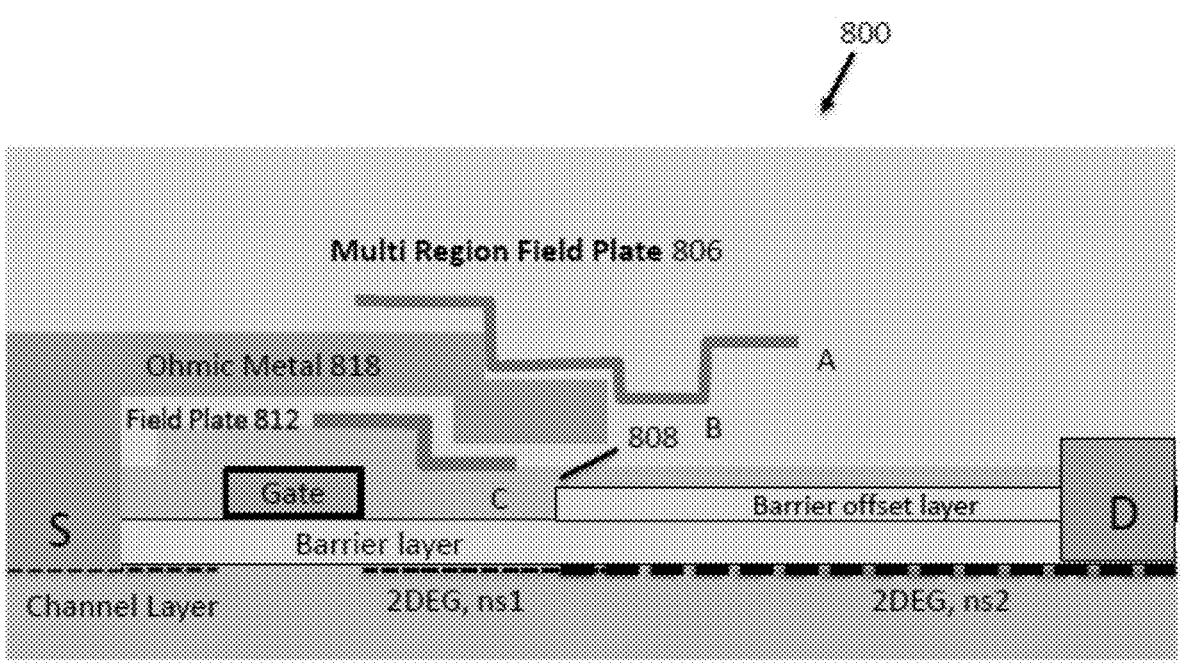
FIG. 8 illustrates a cross-sectional view of the GaN transistor formed according to the fifth embodiment of the present invention.

FIG. 8 shows a fifth embodiment 800 of the invention, similar to the third embodiment 600 of FIG. 6, but with an additional Ohmic metal field plate 818, connected to the source S. Ohmic metal field gate 18 extends between multi-region field plate 806 and underlying field plate 812, completely over the gate and over the edge or transition 808 of the barrier offset layer to further reduce the electric field at the corner of the gate and at the edge or transition 808 of the barrier offset layer.

The various embodiments of the present invention described above are preferably made by the conventional processes and with the conventional materials and parameters described in the above-noted prior art, specifically U.S. Pat. Nos. 8,076,698, 10,096,702, and 9,024,324, the disclosures of which are herein incorporated by reference.

Features in any of the five embodiments described above may be employed in combination with features in other embodiments described herein, and such combinations are considered to be within the spirit and scope of the present invention.

The above description and drawings are only to be considered illustrative of specific embodiments, which achieve the features and advantages described herein. Accordingly, the embodiments of the invention are not considered as being limited by the foregoing description and drawings.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

The invention claimed is:

1. An enhancement mode column III nitride transistor, comprising:

a channel comprising a conductive two-dimensional electron gas (2DEG) formed in a channel layer at a junction with a barrier layer;

a gate, and drain and source contacts, positioned above the barrier layer, wherein the gate is disposed between the source and drain contacts; and a barrier offset layer comprising an insulator positioned above the barrier layer and disposed between the gate and the drain contact, wherein the barrier offset layer has an edge or transition laterally offset from the gate, wherein net electron donor density in the channel layer under barrier offset layer is higher than net electron donor density in the channel layer nearer the gate without the barrier offset layer, such that 2DEG density in the channel layer nearer the gate is higher than 2DEG density in the channel layer under the barrier offset layer;

a multi-region field plate overlaying and overlapping at least a portion of the gate nearest the drain contact and overlapping a portion of the barrier offset layer, the multi-region field plate having a plurality of sections including a section of increased height with respect to the channel layer over the portion of the gate nearest the drain contact, and a section of reduced height with respect to the channel layer over the edge or transition of the barrier offset layer to reduce the electric field at the edge or transition of the barrier offset layer; and an additional field plate under and at least partially overlapping with the multi-region field plate, the additional field plate include a step in height, and the multi-region field plate also including a corresponding step in height over the additional field plate, whereby the step in height of the additional field plate and the corresponding step in height of the multi-region field plate serve to reduce the electric field at the corner of the gate nearest the drain contact.

2. The transistor of claim 1, wherein the column III nitride comprises GaN.

3. The transistor of claim 1, wherein the insulator offset layer comprises SiN.

4. The transistor of claim 1, wherein the multi-region field plate has a step in height between the gate and the edge or transition of the barrier offset layer to further reduce the electric field at the edge or transition of the barrier offset layer.

5. The transistor of claim 1, further comprising a further field plate above and at least partially overlapping the multi-region field plate to smooth and reduce the electric field at the edge or transition of the barrier offset layer.

6. The transistor of claim 1, further comprising an Ohmic metal field plate connected to the source contact, wherein the ohmic metal field gate extends completely over the gate between multi-region field plate and underlying field plate, and completely over the gate and over the edge or transition of the barrier offset layer, to further reduce the electric field at the corner of the gate and at the edge or transition of the barrier offset layer.

* * * * *